United States Patent
Stafford et al.

(10) Patent No.: US 7,125,176 B1
(45) Date of Patent: Oct. 24, 2006

(54) PCB WITH EMBEDDED OPTICAL FIBER

(76) Inventors: John W. Stafford, 15035 S. 19th Way, Phoenix, AZ (US) 85048; George G. Grouch, 2403 E. Geneva Dr., Tempe, AZ (US) 85282; Irka Zazulak, 535 Old Joppa Rd., Joppa, MD (US) 21085

( * ) Notice: Subject to any disclaimer, the term of this patent is extended or adjusted under 35 U.S.C. 154(b) by 288 days.

(21) Appl. No.: 10/674,374

(22) Filed: Sep. 30, 2003

(51) Int. Cl.
*G02B 6/30* (2006.01)
*G02B 6/36* (2006.01)

(52) U.S. Cl. ............................. 385/94; 385/49; 385/88; 385/91

(58) Field of Classification Search ................. 385/14, 385/49, 88, 91, 92, 94, 134, 137
See application file for complete search history.

(56) References Cited

U.S. PATENT DOCUMENTS

| | | | |
|---|---|---|---|
| 5,446,814 A * | 8/1995 | Kuo et al. ............... | 385/31 |
| 5,644,667 A * | 7/1997 | Tabuchi ................. | 385/49 |
| 5,764,832 A * | 6/1998 | Tabuchi ................. | 385/49 |
| 6,330,377 B1 * | 12/2001 | Kosemura .............. | 385/14 |
| 6,389,202 B1 * | 5/2002 | Delpiano et al. ........ | 385/49 |
| 6,907,173 B1 * | 6/2005 | Hiramatsu .............. | 385/126 |

* cited by examiner

*Primary Examiner*—Sung Pak
*Assistant Examiner*—Daniel Petkovsek
(74) *Attorney, Agent, or Firm*—Parsons & Goltry; Robert A. Parsons; Michael W. Goltry

(57) ABSTRACT

High speed high data interconnect apparatus includes a stiffening plate with optical fiber mounting groove defined on a surface thereof. The apparatus further includes a length of optical fiber mounted in the groove on the surface of the stiffening plate in a longitudinally extending direction generally parallel to the surface of the stiffening plate. A reflecting surface is positioned adjacent one, or both, of the opposed ends of the optical fiber to direct light at an angle of approximately ninety degrees to the optical path. A printed circuit board laminate is used to encase the stiffening plate and the optical fiber and includes a light via for the passage of light reflected by the reflecting surface. Bond pads are formed on a surface of the printed circuit board laminate adjacent the light via for the electrical connection of a light element, e.g. a VCSEL or photodiode, in communication with the light via.

25 Claims, 12 Drawing Sheets

PCB WITH EMBEDDED OPTICAL FIBER

FIELD OF THE INVENTION

This invention relates to high speed high data interconnect apparatus and methods.

More particularly, this invention relates to optical fibers embedded in printed circuit boards and coupled to interconnect photonic components or die and semiconductor chips or die.

BACKGROUND OF THE INVENTION

In the electronic industry, there is a need for high speed optical interconnects to pass signals from semiconductor chip to semiconductor chip and board to board in order to fully utilize the emerging capabilities of microprocessors, digital signal processors, etc. A Pentium 4™ microprocessor, for example, operates at 2.4 GHz but the data travels on a bus operating at only 400 MHz. The speed picks up again on an optical fiber telecommunication network. In accordance with to Moore's Law, single chip microprocessors can eventually achieve speeds of tens of teraflops. However, the speed limitation of current copper bus structures is limited at best to 10 GHz. High speed optical interconnect applications are primarily in computers (commercial and military), telecommunications switches, etc.

A number of problems need to be overcome to produce high performance manufacturable optical interconnects that can utilize the existing surface mount manufacturing infrastructure. In any product using optical interconnects there will be a large number of Silicon die. The reason for this is, at the present time, there is only one way to bring software into a system and that is with Silicon. Thus, in the present technology, economics require that any board with optical interconnects be surface mount compatible.

For distances of up to 500 meters, 850 nm emitters and detectors are currently the emitters and detectors of choice. For these distances, data rates far in excess of 1 GHz are readily achievable using glass optical multimode fiber. Optical glass fiber is preferred over organic optical fibers both from an optical power loss and achievable data rate.

It would be highly advantageous, therefore, to remedy the foregoing and other deficiencies inherent in the prior art.

It is an object of the present invention to provide a new and improved printed circuit board with embedded optical fiber for use as a high speed, high data rate interconnect.

It is another object of the present invention to provide a new and improved printed circuit board with embedded optical fiber that is highly manufacturable.

It is another object of the present invention to provide a new and improved printed circuit board with embedded optical fiber that is compatible with surface mounting techniques.

It is another object of the present invention to provide a new and improved printed circuit board with embedded optical fiber that is highly manufacturable.

SUMMARY OF THE INVENTION

The above problems and others are at least partially solved and the above objects and others realized in new and improved high speed data interconnect apparatus, and method of fabrication, including a stiffening plate with optical fiber mounting groove defined on a surface thereof and a length of optical fiber mounted in the groove. The optical fiber includes opposed ends and defines an optical path between the opposed ends. The optical fiber is mounted in the groove on the surface of the stiffening plate in a longitudinally extending direction generally parallel to the surface of the stiffening plate. A reflecting surface is positioned adjacent one of the opposed ends of the optical fiber to direct light at an angle of approximately ninety degrees to the optical path. A printed circuit board laminate encases the stiffening plate and optical fiber and includes a light via for the passage of light reflected by the reflecting surface. Bond pads are formed on a surface of the printed circuit board laminate adjacent the light via for the electrical connection of a light element, such as a vertical cavity surface emitting laser or a photo diode.

The invention also proposes new and improved high speed data interconnect apparatus, and method of fabrication, including a stiffening plate with an elongated optical fiber mounting groove defined on a surface thereof and a length of optical fiber mounted in the groove. The optical fiber includes first and second opposed ends and defines an optical path between the opposed ends. The optical fiber is mounted in the groove on the surface of the stiffening plate in a longitudinally extending direction generally parallel to the surface of the stiffening plate. A first reflecting surface is positioned adjacent the first opposed end of the optical fiber, the first reflecting surface being positioned to direct light at an angle of approximately ninety degrees to the optical path. A second reflecting surface is positioned adjacent the second opposed end of the optical fiber, the second reflecting surface being positioned to direct light at an angle of approximately ninety degrees to the optical path. A printed circuit board laminate encases the stiffening plate and the optical fiber and includes a first light via for the passage of light reflected by the first reflecting surface and a second light via for the passage of light reflected by the second reflecting surface. First bond pads are formed on a surface of the printed circuit board laminate adjacent the first light via and second bond pads are formed on the surface of the printed circuit board laminate adjacent the second light via. A vertical cavity surface emitting laser is mounted on the surface of the printed circuit board laminate in light communication with the first light via, using the first bond pads. A photo detector is mounted on the surface of the printed circuit board laminate in light communication with the second light via, using the second bond pads.

BRIEF DESCRIPTION OF THE DRAWINGS

The foregoing and further and more specific objects and advantages of the invention will become readily apparent to those skilled in the art from the following detailed description taken in conjunction with the drawings in which.

DETAILED DESCRIPTION OF THE DRAWINGS

Figure 1:
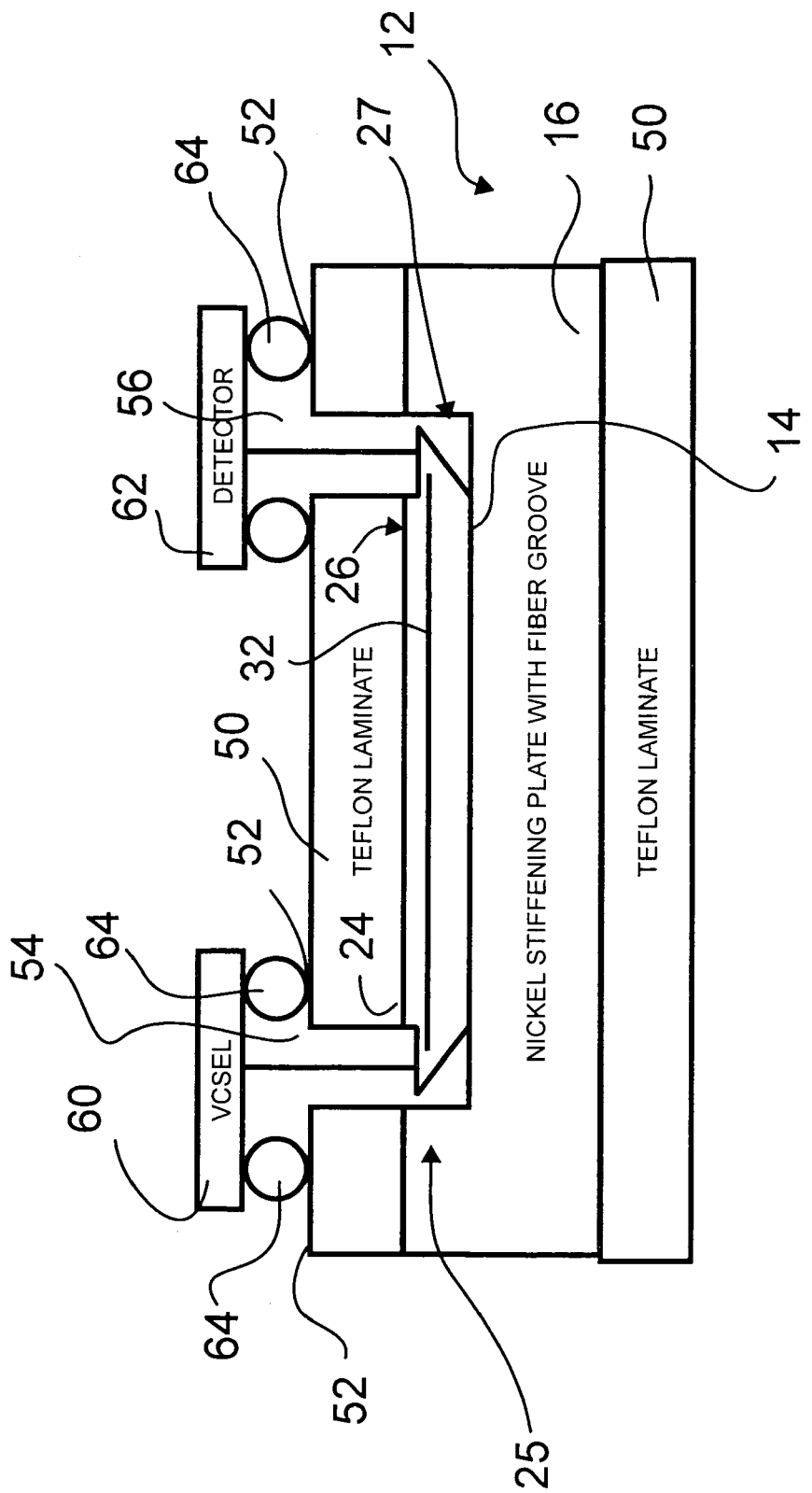
FIG. 1 illustrates an embodiment of a printed circuit board with embedded optical fiber in accordance with the present invention.

Turning to the drawings, attention is first directed to FIG. 1, which illustrates an embodiment of high speed data interconnect apparatus 10 including a printed circuit board 12 with embedded optical fiber 14 in accordance with the present invention. Here it will be understood that the term "printed circuit board" is interchangeable, in this disclosure, with the term "printed wiring board" and either are represented herein by the acronym PCB. Printed circuit board 12 includes a stiffening plate 16 formed of material having a coefficient of thermal expansion approximately matching the coefficient of thermal expansion of optical fiber 14. Matching the coefficients eliminates or greatly reduces any relative movement between stiffening plate 16 and optical fiber 14, thereby substantially eliminating stress in optical fiber 14. In a preferred embodiment, stiffening plate 16 is formed of a nickel iron alloy, the coefficient of thermal expansion of which can be precisely matched (by adjusting the composition of the alloy) to the coefficient of thermal expansion of optical fiber 14.

Figure 4:
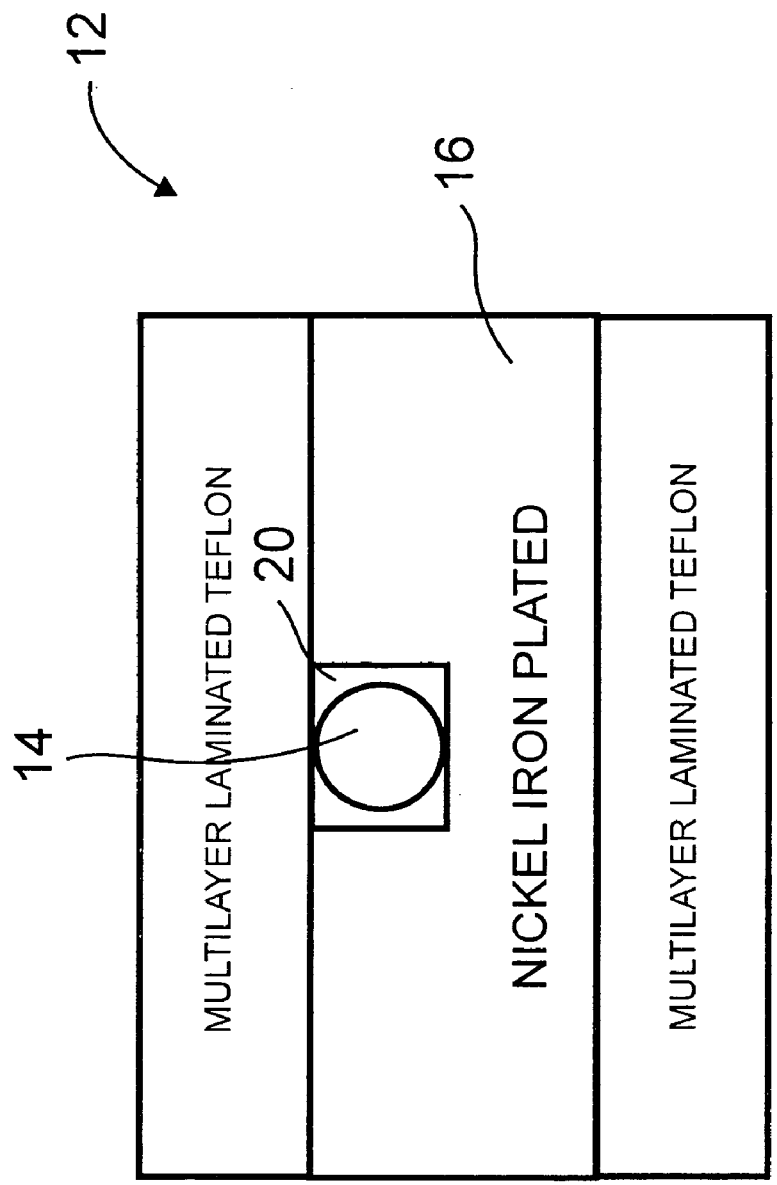
FIG. 4 is an end view of the printed circuit board of FIG. 1, illustrating the position of the embedded optical fiber.

An elongated optical fiber mounting groove 20, one embodiment of which is illustrated in FIG. 4, is formed in the surface of stiffening plate 16. Groove 20 has a generally rectangular shaped cross-section with a depth and width approximately equal to a diameter of the length of optical fiber 14. Groove 20 is fabricated with a width and depth slightly greater than (approximately equal to) the outside diameter of optical fiber 14. Groove 20 can be fabricated by any of the well known semiconductor fabrication processes, such as sawing (in a manner similar to wafer sawing), chemical etching, laser machining, or by electron beam machining. As will be understood, groove 20 need not be a straight line. Further, while a single groove 20 is illustrated herein for purposes of explanation, it will be understood that multiple grooves can be fabricated as required by specific applications. For best results, the width of groove 20 should not exceed the outside diameter of optical fiber 14 (assuming a multi mode fiber with an outside diameter of approximately 125 microns and a core diameter in a range of 50 to 62.5 microns) by more than 10 microns.

Figure 5:
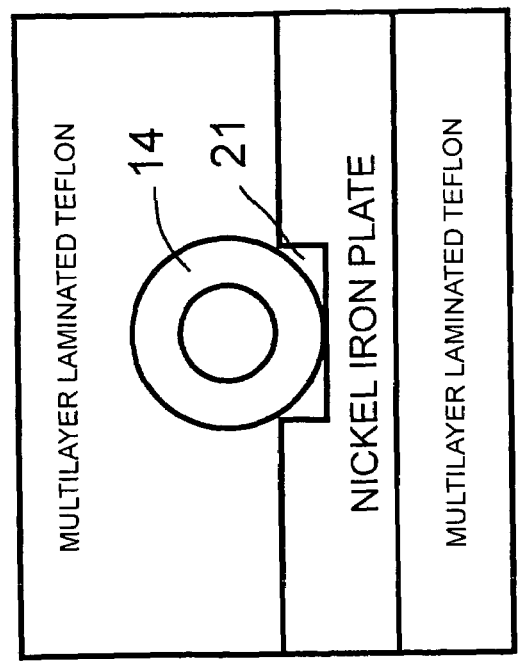
FIG. 5 is an end view illustrating another method of mounting an optical fiber in a printed circuit board.

Another potential embodiment of an elongated optical fiber mounting groove, designated 21, is illustrated in FIG. 5. In this embodiment groove 21 has a shallow rectangular shaped cross-section with a depth and width smaller than the diameter of optical fiber 14. Groove 21 can be conveniently fabricated by the process of metal skiving. This process produces a shallow rectangular groove with precise width and depth. It will of course be understood that other processes can be utilized to fabricate groove 21, such as any of the processes mentioned above. Groove 21 has the advantage of requiring the removal of less material from stiffening plate 16 and generally a simpler fabrication process but provides less support for optical fiber 14.

Figure 6:
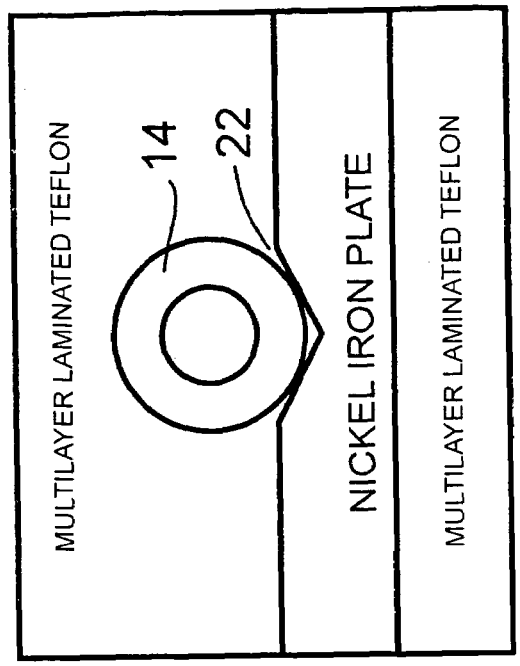
FIG. 6 is an end view illustrating another method of mounting an optical fiber in a printed circuit board.

Another potential embodiment of an elongated optical fiber mounting groove, designated 22, is illustrated in FIG. 6. In this embodiment groove 22 has a generally V-shaped cross-section fabricated by a process of metal scribing. The metal scribing process produces a shallow V-shaped groove with precise depth and sidewall angle. Groove 22 has the advantage of requiring the removal of less material from stiffening plate 16 and generally a simpler fabrication process but provides less support for optical fiber 14. It will be understood that groove 22 can be formed so that optical fiber 14 is wholly embedded therein if more support is desired and the amount of material removed is not a problem.

Optical fiber 14 is positioned in groove 20, for purposes of explanation, in a longitudinally extending direction generally parallel to the surface of stiffening plate 16. Although multimode optical fiber is used for purposes of this explanation, nothing in the invention precludes applying the technology to the use of single mode optical fiber applications (i.e. 1300 nm and 1500 nm). Optical fiber 14 can be locked in place by an adhesive dispensed into groove 20 prior to insertion of optical fiber 14. Optical fiber 14 has opposed ends 24 and 26 with reflecting surfaces 25 and 27 positioned adjacent thereto, respectively. Reflecting surfaces 25 and 27 are positioned to direct light at an angle of approximately ninety degrees to an optical path 32 between opposed ends 24 and 26 of optical fiber 14, i.e. the longitudinal axis of optical fiber 14. Several different embodiments of reflecting surfaces 25 and 27 can be devised, some examples of which are explained below. Here it will be understood that while both ends 24 and 26 of optical fiber 14 have an associated reflecting surface in the embodiment of high speed data interconnect apparatus 10 illustrated in FIG. 1, other embodiments are contemplated, some of which are explained below, in which only one end has an associated reflecting surface.

Figure 3:
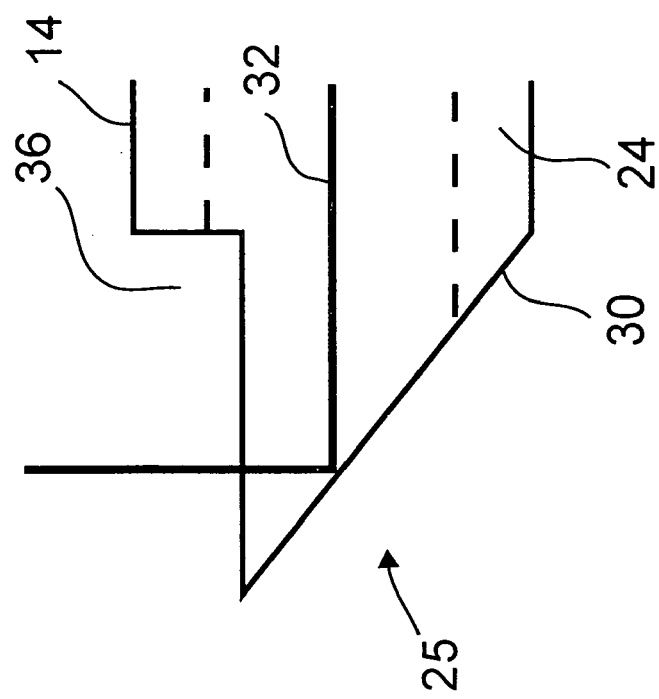
FIGS. 2 and 3 illustrate end and side views, respectively, of the optical fiber used in the printed circuit board of FIG. 1.
Figure 2:
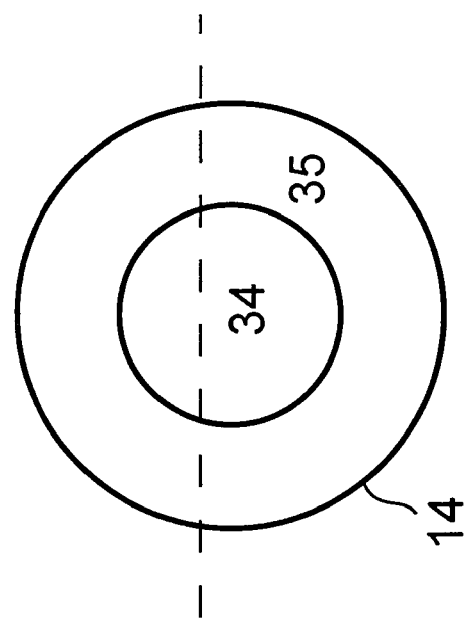

In a first embodiment, illustrated in detail in FIGS. 2 and 3, the reflecting surface 25 associated with end 24 is illustrated for purposes of this explanation. Reflecting surface 25 includes an angular cut in optical fiber 14 adjacent opposed end 24 to define a cut surface 30 positioned at an angle of approximately 45 degrees to the optical path 32. To enhance reflection, cut surface 30 is mirrored or otherwise coated with a reflecting material. It will be understood that mirroring or coating is optional and sufficient coating may be provided by the adhesive material in groove 20 to provide the desired reflecting characteristics. Optical fiber 14, consisting of core 34 and cladding 35, has a portion 36 (see FIG. 3) of cladding 35 removed in a small section opposite cut surface 30 to allow light to enter or exit optical fiber 14.

Figure 7:
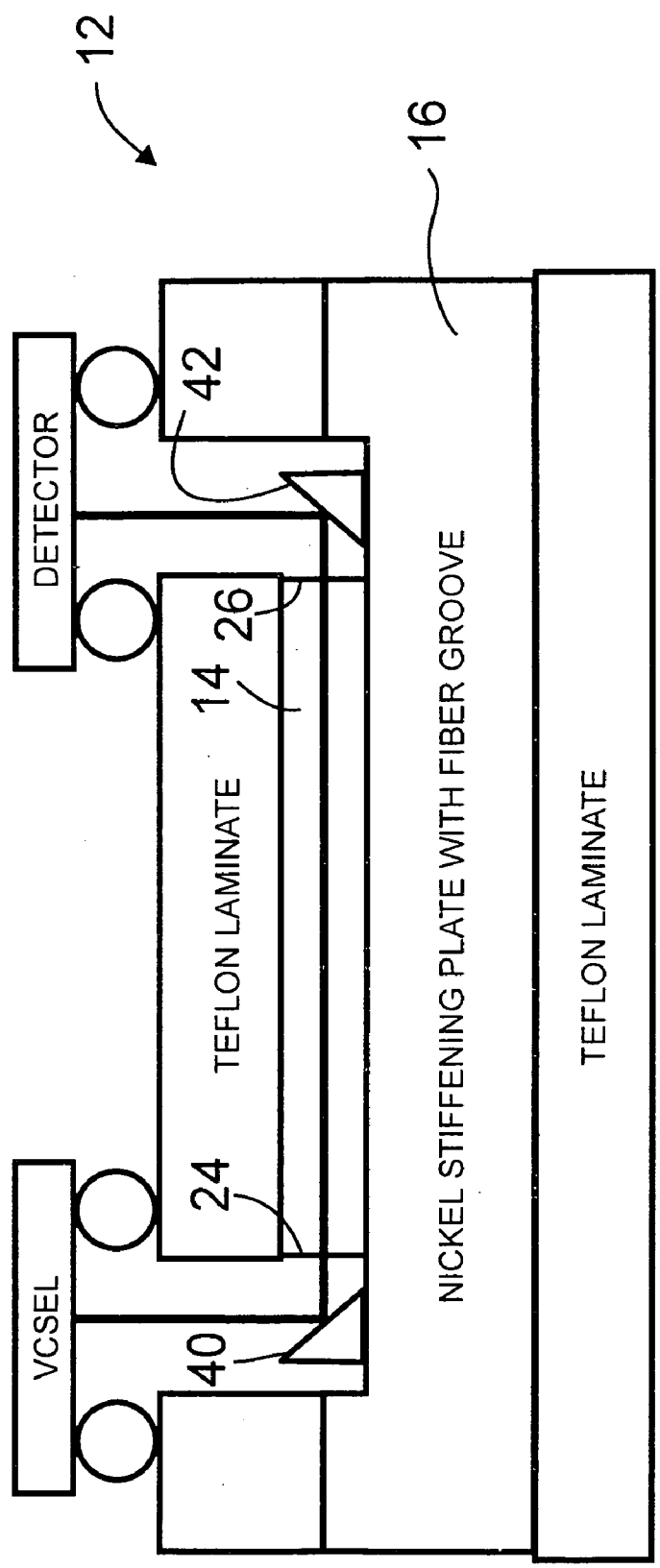
FIG. 7 illustrates an embodiment of a printed circuit board with optical fiber embedded in using one of the methods illustrated in FIG. 5 or 6 in accordance with the present invention.

In another embodiment, illustrated in detail in FIG. 7, the reflecting surfaces include micro mirrors 40 and 42 mounted in groove 20 on the surface of stiffening plate 16 in optical alignment with optical path 32 and a light via, to be explained presently. In this embodiment, components of high speed data interconnect apparatus 10 similar to components in the embodiment of FIG. 1 are designated with similar numbers to indicate the interchangeability of the various components. In this embodiment optical fiber 14 has simply cleaved and polished ends so that no rotational alignment is needed. Small 45 degree micro mirrors 40 and 42 are inserted and bonded into groove 20, which is extended slightly in length to accommodate the mirrors. In a slightly different embodiment, a 45 degree chamfer is cut into one or both ends of groove 20 and plated with a non tarnishing reflecting plating (such as nickel/gold, etc.) to form reflecting surfaces or mirrors.

Figure 8:
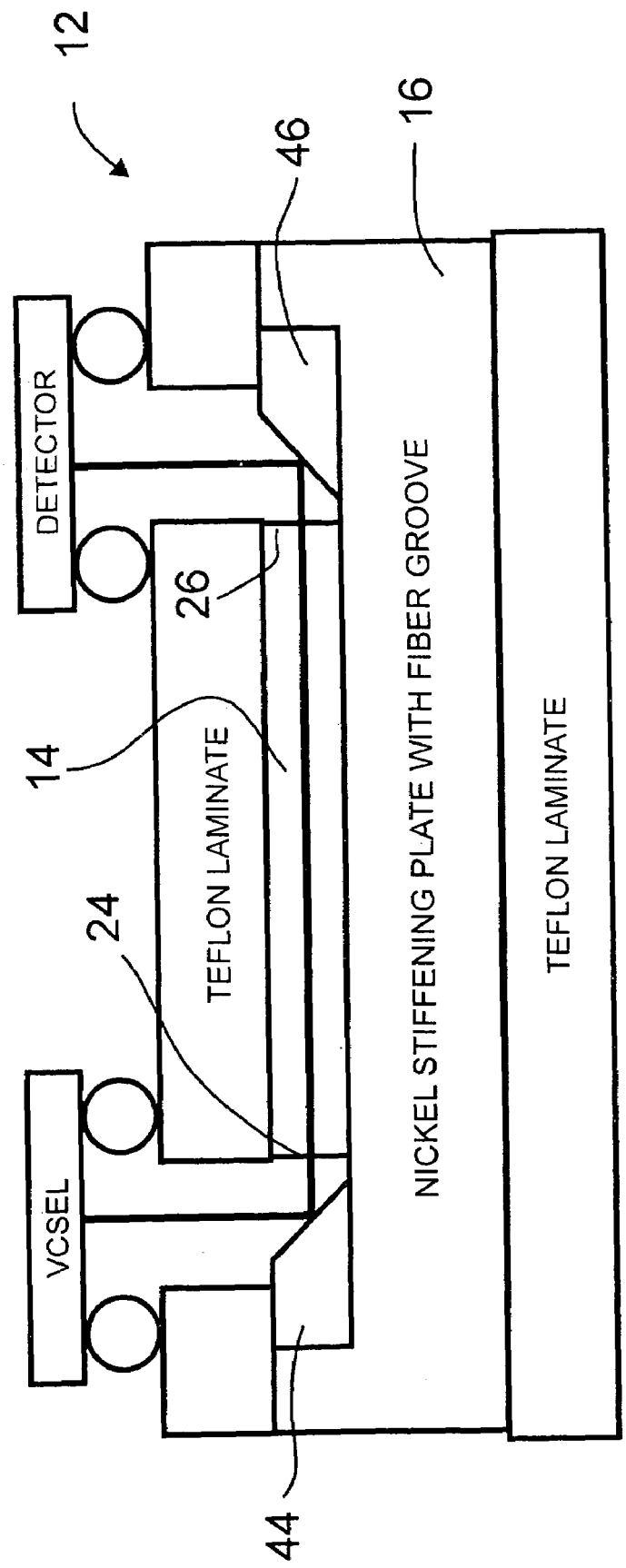
FIG. 8 illustrates another embodiment of a printed circuit board with embedded optical fiber in accordance with the present invention.

Turning now to FIG. 8, another embodiment of reflecting surfaces in association with the ends of optical fiber 14 is illustrated. In this embodiment the ends 24 and 26 are simply cleaved and polished so that no rotational alignment is needed. Optical fiber portions 44 and 46, each with an approximately 45 degree mirrored end, are mounted in groove 20 in optical alignment with optical path 32 and a light via in association with ends 24 and 26, respectively, of optical fiber 14. Generally, optical fiber portions 44 and 46 will be formed from an optical fiber similar to optical fiber 14 (in this embodiment a multi mode optical fiber) so as to match diameters. Preferably, the ends of optical fiber portions 44 and 46 are chamfered at 45 degrees and mirrored for optimum reflecting characteristics. In addition to or in lieu of beveled mirrored optical fiber portions, reflecting surfaces can be made from wire or other structure with a circular, square, rectangular, or other cross-section, which is beveled and metalized or otherwise mirrored.

Referring again to FIG. 1, a printed circuit board laminate 50 is applied to stiffening plate 16, both upper and lower surfaces, to encase stiffening plate 16 and optical fiber 14. In the preferred embodiment, Teflon is included as the laminate because of its bonding and thermal characteristics but any other known material for fabricating printed circuit boards can be used. Alignment marks are provided on stiffening plate 16 for use in guiding the positioning of a laminate conductor pattern with bond pads 52 to allow the affixing of solder bumped photonic or semiconductor die and the like directly to the printed circuit board produced by the laminate process. After lamination and conductor patterning of the layer or layers of laminate 50 one or more vias, e.g. vias 54 and 56, can be opened through laminate 50 in alignment with reflecting surfaces 25 and 27, respectively. Vias 54 and 56 can be opened, for example by laser ablation, or they can be pre-punched prior to lamination. For example, a CO2, YAG, or Eximer laser can be used to ablate vias. Laminate 50 can have vias 54 and 56 pre-punched and by precisely aligning laminate 50 with stiffening plate 16 and bonding the two together, no ablation of vias is required. This printed circuit board concept allows other supporting semiconductor dies to be mounted and interconnected so that data generated can be converted from electrical to optical or optical to electric as will become apparent presently.

Figure 9:
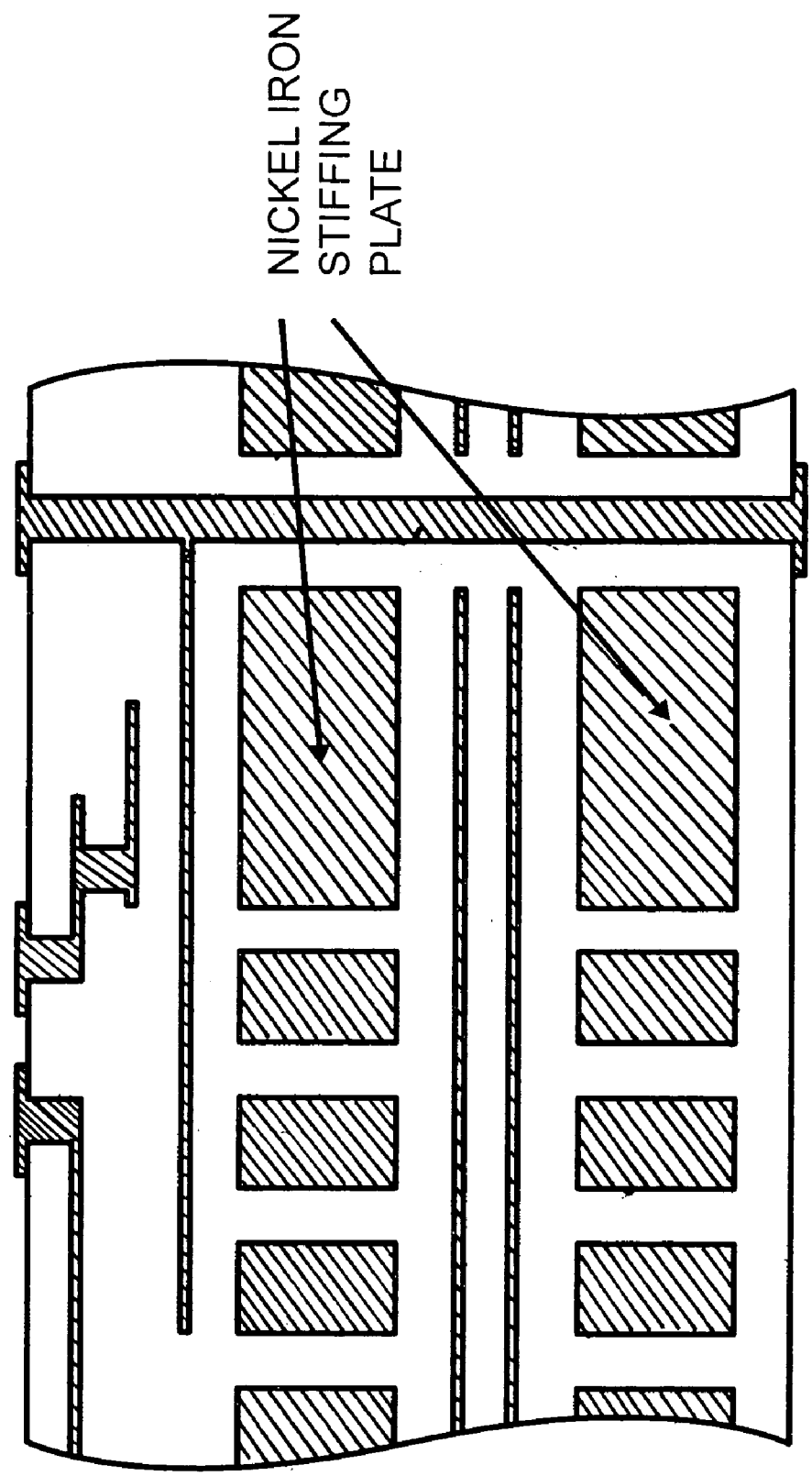
FIG. 9 is a view in cross-section illustrating an embodiment of multiple stiffening plates used in the printed circuit board, in accordance with the present invention.

To maintain the positional accuracy of light elements mounted above vias 54 and 56 to reflecting surfaces 25 and 27, laminate 50 on which they are mounted is preferably not too thick so that stiffening plate 16 constrains the movement of the top surface of laminate 50. The nickel iron of stiffening plate 16 has a much higher Modulus of Elasticity than the Teflon of laminate 50. Generally, a thickness of Teflon laminate 50 up to two times the thickness of nickel iron stiffening plate 16 is preferred. If vias are included that go through stiffening plate 16, holes can be provided and plugged with Teflon, as illustrated in FIG. 9, prior to lamination to allow a continuous thickness of the Teflon. Generally, soft laminating material, such as Teflon, can be laminated directly over optical fiber 14 without causing damage to optical fiber 14. Stiffer laminates usually need to be recessed so as not to impose an unduly large stress on optical fiber 14. Such a recess can contain a soft bonding medium or encapsulant to fully enclose and protect optical fiber 14.

Laminate 50 and bond pads 52 allow affixing light elements, such as vertical cavity surface emitting laser (VCSEL) 60 and photo detector 62, directly over vias 54 and 56 leading to reflecting surfaces 25 and 27 associated with opposed ends 24 and 26 of optical fiber 14. The light elements can either self-align using eutectic solder bumps 64 or, for non eutectic solder bumps, be machine aligned and positioned precisely over reflecting surfaces 25 and 27. It will of course be understood that other solders, welds, or electrical and physical connecting materials can be used if convenient. In this embodiment a VCSEL 60 is positioned, electrically connected, and physically held over via 54 using eutectic solder balls 64. Also, a photo detector 62 is positioned, electrically connected, and physically held over via 54 using eutectic solder balls 64. It should be understood that no-lead solder and/or other solders can be used in place of eutectic solder balls if desired. In this case, the device being attached may require vision alignment and precision placement. Other supporting semiconductor die (not shown) are clustered around VCSEL 60 and photo detector 62 and electrically connected to each other and to VCSEL 60 and photo detector 62 by conductive traces in laminate 50. Thus, electrical signals at one location are converted to optical signals (light pulses) by VCSEL 60 and directed into optical fiber 14 by reflecting surface 25. The light pulses are directed onto photo detector 62 at a remote location by reflecting surface 27 and converted back to electrical signals, which are then coupled to a cluster of semiconductor die (not shown) adjacent photo detector 62. It will be understood that multiple numbers of optical interconnects can be incorporated on the same printed circuit board. In general, both VCSEL 60 and photo detector 62 are encapsulated, after assembly, using a suitable optical under encapsulant to provide environmental protection.

Figure 10:
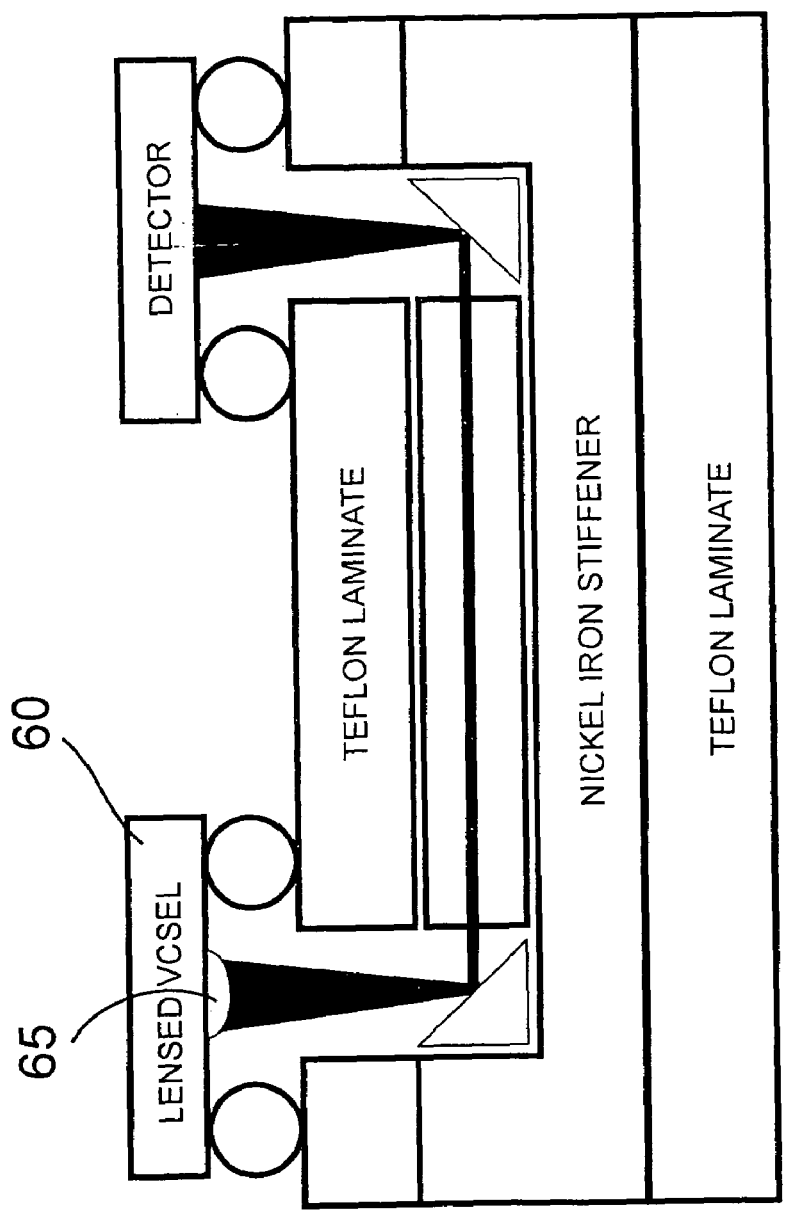
FIG. 10 illustrates another embodiment of a printed circuit board with embedded optical fiber in accordance with the present invention.
Figure 11:
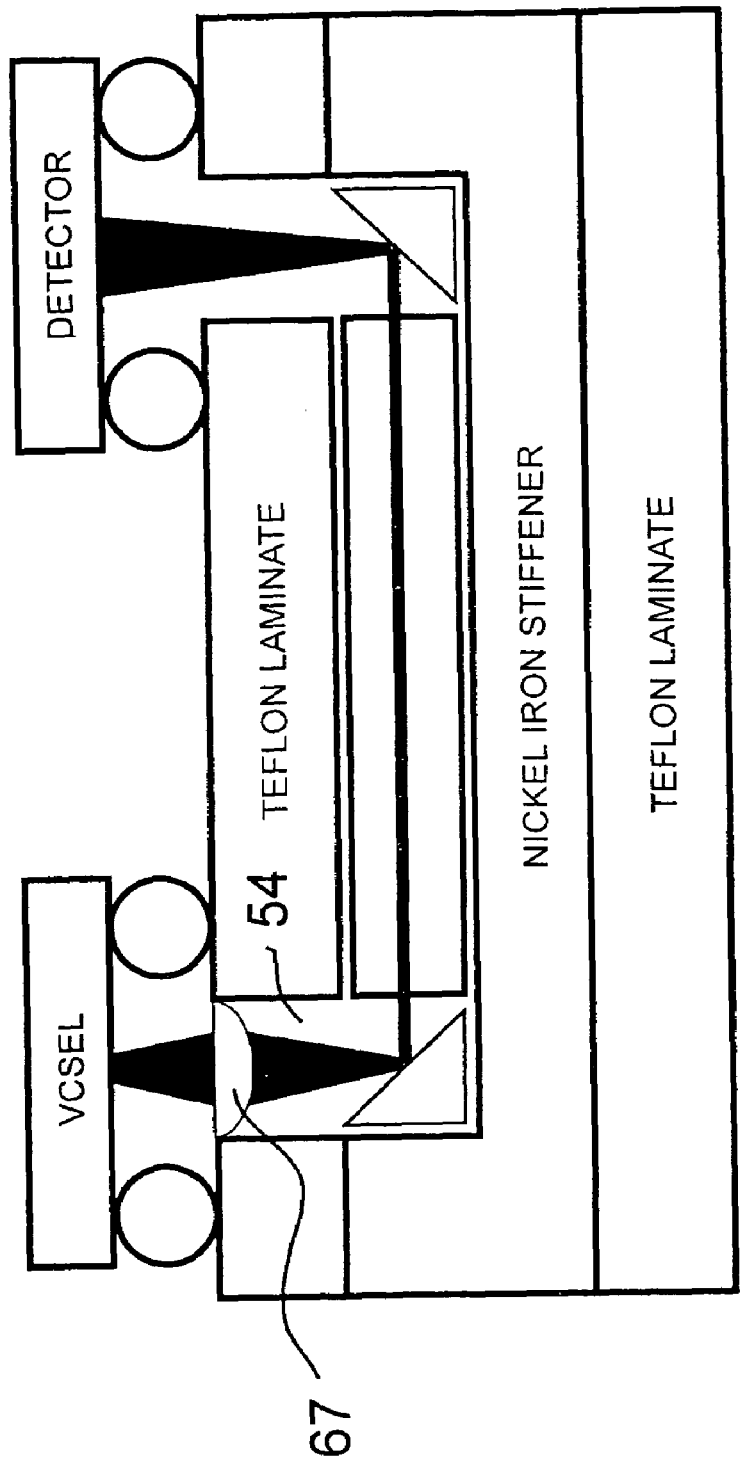
FIG. 11 illustrates another embodiment of a printed circuit board with embedded optical fiber in accordance with the present invention.

Usually, VCSELs are fabricated in a package that includes a lens (see for example VCSEL 60 and lens 65 in FIG. 10) to focus substantially all of the optical energy onto the reflecting surface in the via aligned with the VCSEL. However, in the event that the VCSEL does not include a lens or to provide additional focusing, a lens 67 (see FIG. 11) can be embedded in the associated via (e.g. via 54). Also, while focusing at the photo detector is generally not required, a lens or lenses can be included with the photo detector or in the associated via (e.g. photo detector 62 and via 56) if desired.

Figure 12:
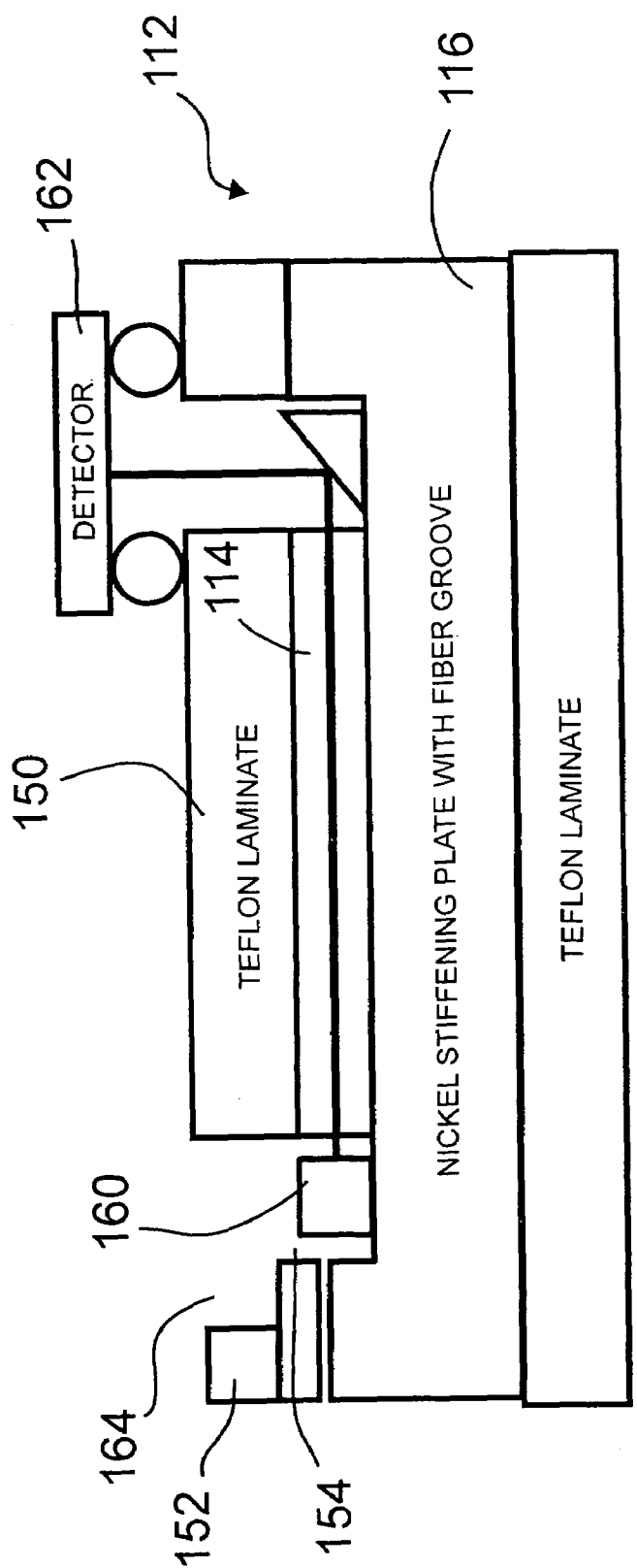
FIG. 12 illustrates another embodiment of a printed circuit board with embedded optical fiber in accordance with the present invention.

Turning now to FIG. 12, another embodiment is illustrated of high speed data interconnect apparatus, designated 100, including a printed circuit board 112 with embedded optical fiber 114 in accordance with the present invention. Components similar to components in FIG. 1 are designated with similar numbers, having a "1" added to indicate a different embodiment. In this embodiment a cavity 154 (similar to via 54 in FIG. 1) is formed in laminate 150 prior to bonding to stiffening plate 116 or could be laser machined in after bonding. An edge emitting laser 160 is positioned in cavity 154 in optical alignment with optical fiber 114 and die bonded to a suitably prepared surface on stiffening plate 116. Edge emitting laser 160 is then wire bonded with wires 164 to bond pads 152 on laminate 150. A suitable optical encapsulant is used to provided environmental protection to edge emitting laser 160. Also, a cover (not shown) is bonded over cavity 154 for finger protection and a suitable optical under encapsulant is used to provide environmental protection to surface mounted photo detector 162. It will be understood that an edge detector and VCSEL could be substituted for photo detector 162 and edged emitting laser 160, respectively, if desired. Also, an edge detector could be mounted in a cavity, similar to that shown for edge emitting laser 160, in place of surface mounted photo detector 162.

Figure 13:
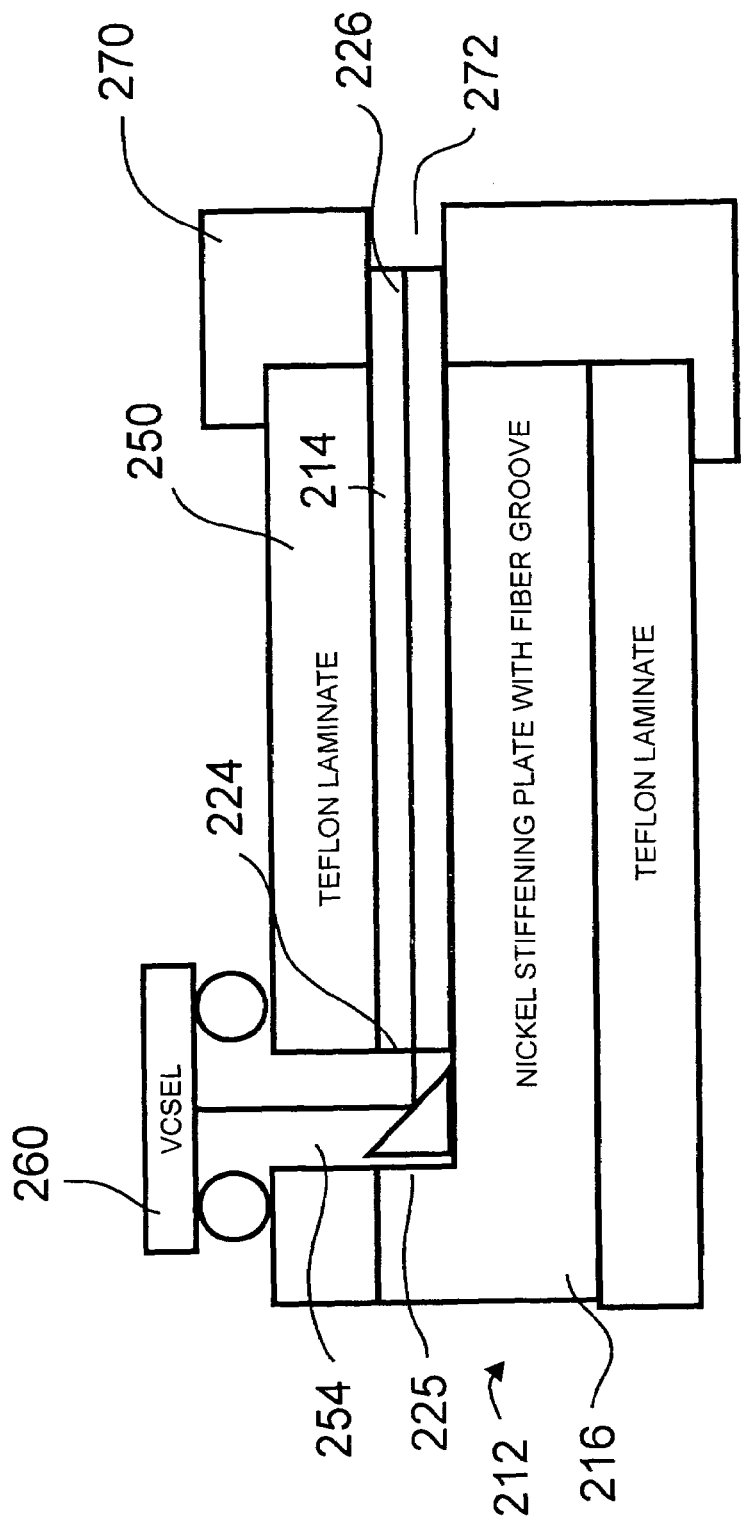
FIG. 13 illustrates another embodiment of a printed circuit board with embedded optical fiber in accordance with the present invention.
Figure 14:
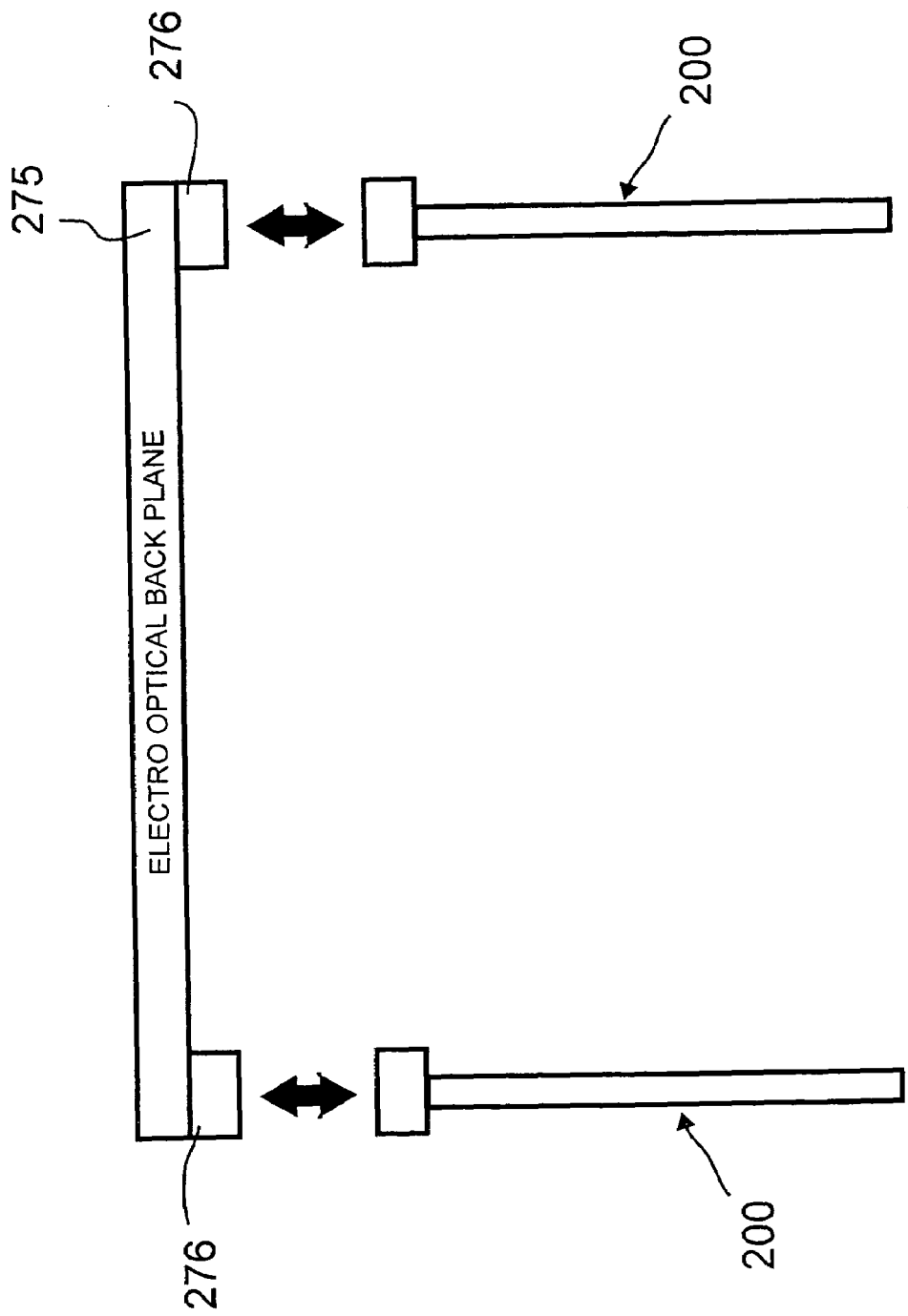
FIG. 14 illustrates a combination of printed circuit boards formed in accordance with the embodiment illustrated in FIG. 13.

Turning now to FIG. 13, another embodiment is illustrated of high speed data interconnect apparatus, designated 200, including a printed circuit board 212 with embedded optical fiber 214 in accordance with the present invention. Components similar to components in FIG. 1 are designated with similar numbers, having a "2" added to indicate a different embodiment. In this embodiment, the optical interconnect is terminated in a printed circuit board optical edge connector 270. Here VCSEL 260 introduces optical signals (light pulses) into end 224 of optical fiber 214 as described in conjunction with FIG. 1. However, the opposed end, end 226, has no reflecting surface associated with it but terminates in a via 272 in optical edge connector 270. It will be understood that while VCSEL 260 is illustrated for convenience, a photo detector, edge emitting laser or edge illuminated detector could be used as a light element in apparatus 200. Any of these components would be mounted and connected as these components are described above. As illustrated in FIG. 14, apparatus 200 can then be coupled to an electro optical back plane 275 or the like through optical connectors 276.

Thus, a new and improved printed circuit board with embedded optical fiber has been described for use as a high speed, high data rate interconnect. The new and improved printed circuit board with embedded optical fiber is highly manufacturable and is compatible with surface mounting techniques presently used in the semiconductor industry. Also, a variety of optical elements, including VCSELs, photo detectors, edge emitting lasers, and edge luminated detectors, can be easily incorporated with few changes to the basic structure.

Various changes and modifications to one or more of the embodiments herein chosen for purposes of illustration will readily occur to those skilled in the art. To the extent that such modifications and variations do not depart from the spirit of the invention, they are intended to be included within the scope thereof, which is assessed only by a fair interpretation of the following claims.

Having fully described the invention in such clear and concise terms as to enable those skilled in the art to understand and practice the same.

The invention claimed is:

1. High speed high data interconnect apparatus comprising:
   a stiffening plate with optical fiber mounting groove defined on a surface thereof, wherein the stiffening plate has a coefficient of thermal expansion approximately matching a coefficient of thermal expansion of the optical fiber for reducing relative movement between the stiffening plate and the optical fiber and substantially eliminating stress in the optical fiber;
   a length of optical fiber with opposed ends and defining an optical path between the opposed ends, the optical fiber being mounted in the groove on the surface of the stiffening plate in a longitudinally extending direction generally parallel to the surface of the stiffening plate;
   a reflecting surface positioned adjacent one of the opposed ends of the optical fiber, the reflecting surface being positioned to direct light at an angle of approximately ninety degrees to the optical path between the opposed ends of the optical fiber; and
   a printed circuit board laminate encasing the stiffening plate and the optical fiber and including a light via for the passage of light reflected by the reflecting surface, and bond pads formed on a surface of the printed circuit board laminate adjacent the light via for the electrical connection of a light element.

2. High speed data interconnect apparatus as claimed in claim 1 wherein the light element includes one of a vertical cavity surface emitting laser and a photo detector mounted on the surface of the printed circuit board laminate in light communication with the light via, using the bond pads formed adjacent the light via.

3. High speed data interconnect apparatus as claimed in claim 1 further including a second reflecting surface positioned adjacent another of the opposed ends, the second reflecting surface being positioned to direct light at an angle of approximately ninety degrees to the optical path between the opposed ends of the optical fiber, a second light via for the passage of light reflected by the second reflecting surface, and bond pads formed on a surface of the printed circuit board laminate adjacent the second light via for the electrical connection of a second light element.

4. High speed data interconnect apparatus as claimed in claim 3 wherein the light element includes a vertical cavity surface emitting laser and the second light element includes a photo detector.

5. High speed data interconnect apparatus as claimed in claim 1 wherein the stiffening plate includes nickel iron.

6. High speed data interconnect apparatus as claimed in claim 1 wherein the printed circuit board laminate encasing the stiffening plate includes Teflon.

7. High speed data interconnect apparatus as claimed in claim 1 wherein the optical fiber mounting groove in the stiffening plate has a generally rectangular shaped cross-section with a depth and width approximately equal to a diameter of the length of optical fiber.

8. High speed data interconnect apparatus as claimed in claim 1 wherein the optical fiber mounting groove in the stiffening plate has a shallow rectangular shaped cross-section with a depth and width smaller than a diameter of the length of optical fiber.

9. High speed data interconnect apparatus as claimed in claim 1 wherein the optical fiber mounting groove in the stiffening plate has a generally V-shaped cross-section.

10. High speed data interconnect apparatus as claimed in claim 1 wherein the reflecting surface includes a cut in the optical fiber adjacent the one of the opposed ends of the optical fiber defining a cut surface positioned at an angle of approximately 45 degrees to the optical path.

11. High speed data interconnect apparatus as claimed in claim 10 wherein the cut surface has a reflecting material positioned thereon.

12. High speed data interconnect apparatus as claimed in claim 1 wherein the reflecting surface includes a micro mirror mounted in the groove on the surface of the stiffening plate in optical alignment with the optical path and the light via.

13. High speed data interconnect apparatus as claimed in claim 1 wherein the reflecting surface includes an optical fiber portion with an approximately 45 degree mirrored end mounted in the groove on the surface of the stiffening plate in optical alignment with the optical path and the light via.

14. High speed data interconnect apparatus as claimed in claim 1 including in addition an edge emitting laser mounted in the groove on the surface of the stiffening plate in optical alignment with the optical path and a photo detector mounted on the surface of the printed circuit board laminate in light communication with the light via, using the bond pads formed adjacent the light via.

15. High speed data interconnect apparatus as claimed in claim 1 further including a printed circuit board affixed to an edge of the stiffening plate and printed circuit board laminate adjacent another one of the opposed ends of the optical fiber, the another one of the opposed ends of the optical fiber being optically accessible at the printed circuit board.

16. High speed data interconnect apparatus as claimed in claim 1 wherein the stiffening plate has a higher Modulus of Elasticity than the laminate to constrain movement of a top surface of laminate relative to the stiffening plate.

17. High speed data interconnect apparatus as claimed in claim 16 wherein the printed circuit board laminate has a thickness in a range of up to two times a thickness of the stiffening plate.

18. High speed data interconnect apparatus comprising:
a stiffening plate with an elongated optical fiber mounting groove defined on a surface thereof, wherein the stiffening plate has a coefficient of thermal expansion approximately matching a coefficient of thermal expansion of the optical fiber for reducing relative movement between the stiffening plate and the optical fiber and substantially eliminating stress in the optical fiber;
a length of optical fiber with first and second opposed ends and defining an optical path between the opposed ends, the optical fiber being mounted in the groove on the surface of the stiffening plate in a longitudinally extending direction generally parallel to the surface of the stiffening plate;
a first reflecting surface positioned adjacent the first opposed end of the optical fiber, the first reflecting surface being positioned to direct light at an angle of approximately ninety degrees to the optical path and a second reflecting surface positioned adjacent the second opposed end of the optical fiber, the second reflecting surface being positioned to direct light at an angle of approximately ninety degrees to the optical path;
a printed circuit board laminate encasing the stiffening plate and the optical fiber and including a first light via for the passage of light reflected by the first reflecting surface and a second light via for the passage of light reflected by the second reflecting surface, and first bond pads formed on a surface of the printed circuit board laminate adjacent the first light via and second bond pads formed on a surface of the printed circuit board laminate adjacent the second light via;
a vertical cavity surface emitting laser mounted on the surface of the printed circuit board laminate in light communication with the first light via, using the first bond pads formed adjacent the first light via; and
a photo detector mounted on the surface of the printed circuit board laminate in light communication with the second light via, using the second bond pads formed adjacent the second light via.

19. High speed data interconnect apparatus as claimed in claim 18 wherein the stiffening plate has a higher Modulus of Elasticity than the laminate to constrain movement of a top surface of laminate relative to the stiffening plate.

20. High speed data interconnect apparatus as claimed in claim 19 wherein the printed circuit board laminate has a thickness in a range of up to two times a thickness of the stiffening plate.

21. High speed data interconnect apparatus as claimed in claim 18 wherein the elongated optical fiber mounting groove includes one of a generally rectangular shaped cross-section with a depth and width approximately equal to a diameter of the length of optical fiber, a shallow rectangular shaped cross-section with a depth and width smaller than a diameter of the length of optical fiber, and a generally V-shaped cross-section.

22. High speed data interconnect apparatus as claimed in claim 18 wherein the first and second reflecting surfaces each include one of a cut in the optical fiber adjacent one of the first and second opposed ends of the optical fiber, respectively, defining a cut surface positioned at an angle of approximately 45 degrees to the optical path and in optical alignment with the optical path and the one of the first and second light vias, respectively, a micro mirror mounted in the groove on the surface of the stiffening plate in optical alignment with the optical path and one of the first and second light vias, respectively, and an optical fiber portion with an approximately 45 degree mirrored end mounted in the groove on the surface of the stiffening plate in optical alignment with the optical path and one of the first and second light vias, respectively.

23. High speed data interconnect apparatus comprising:
a stiffening plate with an elongated optical fiber mounting groove defined on a surface thereof, the stiffening plate has a coefficient of thermal expansion approximately matching a coefficient of thermal expansion of the optical fiber for reducing relative movement between the stiffening plate and the optical fiber and substantially eliminate stress in the optical fiber;
a length of optical fiber with first and second opposed ends and defining an optical path between the opposed ends, the optical fiber being mounted in the groove on the surface of the stiffening plate in a longitudinally extending direction generally parallel to the surface of the stiffening plate;
a printed circuit board laminate encasing the stiffening plate and the optical fiber and including a first via through the laminate and a second via through the laminate, and at least first bond pads formed on a surface of the printed circuit board laminate adjacent the first light via, and the stiffening plate has a Modulus of Elasticity higher than a Modulus of Elasticity of the laminate for constraining movement of the surface of the laminate and the first bond pads mounted thereon relative to the stiffening plate and the optical fiber; and
an optical element electrically coupled to the first bond pads and positioned adjacent the first via in optical alignment with the first end of the length of optical fiber, wherein the optical element is mounted on the first bond pads so as to be positioned adjacent the first via in optical alignment with the first end of the length of optical fiber.

24. High speed data interconnect apparatus as claimed in claim 23 wherein the stiffening plate has a higher Modulus of Elasticity than the laminate to constrain movement of a top surface of laminate relative to the stiffening plate.

25. High speed data interconnect apparatus as claimed in claim 24 wherein the printed circuit board laminate has a thickness in a range of up to two times a thickness of the stiffening plate.

* * * * *